(12) United States Patent
Kita et al.

(10) Patent No.: US 8,383,230 B2
(45) Date of Patent: Feb. 26, 2013

(54) FLEXIBLE PRINTED WIRING BOARD, MULTILAYERED FLEXIBLE PRINTED WIRING BOARD, AND MOBILE TELEPHONE TERMINAL EMPLOYING MULTILAYERED FLEXIBLE PRINTED WIRING BOARD

(75) Inventors: Kazuhide Kita, Joetsu (JP); Hirokazu Hirai, Joetsu (JP); Shuichi Fujita, Joetsu (JP); Takashi Miwa, Joetsu (JP)

(73) Assignee: Arisawa Mfg. Co., Ltd., Niigata (JP)

( * ) Notice: Subject to any disclaimer, the term of this patent is extended or adjusted under 35 U.S.C. 154(b) by 1057 days.

(21) Appl. No.: 11/805,972

(22) Filed: May 24, 2007

(65) Prior Publication Data

US 2008/0289860 A1    Nov. 27, 2008

(51) Int. Cl.
*B32B 15/00* (2006.01)
*H05K 1/00* (2006.01)

(52) U.S. Cl. ............... 428/209; 428/458; 428/473.5; 428/623; 428/626; 174/254; 174/258; 361/749; 361/750

(58) Field of Classification Search .......... 428/209, 428/901, 458, 473.5, 623, 626; 174/250–255, 174/258; 361/749, 750
See application file for complete search history.

(56) References Cited

U.S. PATENT DOCUMENTS 3,471,348 A * 10/1969 Iles et al. .............. 216/18
3,526,568 A *  9/1970 Martello et al. ........ 428/337
3,536,545 A * 10/1970 Ruffing et al. ......... 216/19

(Continued)

FOREIGN PATENT DOCUMENTS

CN    1421729 A    6/2003
EP    0773710 A1   5/1997

(Continued)

OTHER PUBLICATIONS

Patent Office Notice of Request for Submission of Argument in related application No. KR 10-2006-2492, Dec. 12, 2006, 6 pages. (Korean original plus English translation).

(Continued)

*Primary Examiner* — Cathy Lam
(74) *Attorney, Agent, or Firm* — Drinker Biddle & Reath LLP

(57) ABSTRACT

An object of the present invention is to provide a flexible printed wiring board and multilayered flexible printed wiring board in which, in methods of laminating substrates comprising a non-adhering section and an adhering section, adhesion of the FPC substrates of the flexure part can be prevented and adequate flex resistance can be maintained.

The present invention provides a flexible printed wiring board comprising at least an electric insulating layer and a conductor layer wherein the surface of the electric insulating layer has a 10-point average roughness of at least 1.5 μm and less than 2.0 μm and contact angle of at least 60° and less than 120°, or has a 10-point average roughness of at least 2.0 μm and less than 4.0 μm, and also provides a multilayered flexible printed wiring board formed by the lamination of two or more of the flexible printed wiring boards in which the surface of the electric insulating layers of the two or more flexible printed wiring boards exposed in a bendable state are opposing in a non-adhered state, and a part of the wiring boards is laminated on each of a first multilayered flexible printed wiring board and a second multilayered flexible printed wiring board.

10 Claims, 7 Drawing Sheets

U.S. PATENT DOCUMENTS

| | | | | |
|---|---|---|---|---|
| 4,074,419 A * | 2/1978 | Hanni et al. | | 29/846 |
| 4,800,461 A * | 1/1989 | Dixon et al. | | 361/751 |
| 5,121,297 A * | 6/1992 | Haas | | 361/751 |
| 5,206,463 A * | 4/1993 | DeMaso et al. | | 174/254 |
| 5,214,571 A * | 5/1993 | Dahlgren et al. | | 361/795 |
| 5,473,118 A * | 12/1995 | Fukutake et al. | | 174/258 |
| 5,505,321 A * | 4/1996 | Caron et al. | | 216/20 |
| 5,516,989 A | 5/1996 | Uedo et al. | | |
| 5,723,205 A * | 3/1998 | Millette et al. | | 428/209 |
| 6,212,769 B1 * | 4/2001 | Boyko et al. | | 29/852 |
| 6,246,009 B1 * | 6/2001 | Millette et al. | | 174/254 |
| 6,288,343 B1 * | 9/2001 | Ahn et al. | | 174/254 |
| 6,350,387 B2 * | 2/2002 | Caron et al. | | 430/314 |
| 6,384,339 B1 * | 5/2002 | Neuman | | 174/254 |
| 7,282,255 B2 | 10/2007 | Hiranaka et al. | | |
| 7,312,400 B2 * | 12/2007 | Ito et al. | | 174/250 |
| 7,453,045 B2 * | 11/2008 | Myoung et al. | | 174/254 |
| 7,596,863 B2 * | 10/2009 | Bhatt et al. | | 29/852 |

FOREIGN PATENT DOCUMENTS

| | | |
|---|---|---|
| JP | 64-080099 A | 3/1989 |
| JP | 07-312469 A | 11/1995 |
| JP | 07-316290 A | 12/1995 |
| JP | 8-330728 A | 12/1996 |
| JP | 2001-015976 A | 1/2001 |
| JP | 2002-256085 A | 9/2002 |
| JP | 2003-133734 A | 5/2003 |
| JP | 2004-31370 A | 1/2004 |
| JP | 2004-241785 A | 8/2004 |
| JP | 2004-273744 A | 9/2004 |
| JP | 2006-181780 A | 7/2006 |
| JP | 2006-196548 A | 7/2006 |

OTHER PUBLICATIONS

Office Action established for JP2008-035730 (Jul. 5, 2011).

* cited by examiner

MOBILE TELEPHONE

2-LAYERED SUBSTRATE

3-LAYERED SUBSTRATE

COVERLAY-AFFIXED FLEXIBLE PRINTED WIRING BOARD

FLEXIBLE PRINTED WIRING BOARD, MULTILAYERED FLEXIBLE PRINTED WIRING BOARD, AND MOBILE TELEPHONE TERMINAL EMPLOYING MULTILAYERED FLEXIBLE PRINTED WIRING BOARD

BACKGROUND

The present invention relates to a flexible printed wiring board and multilayered flexible printed wiring board, and to a mobile telephone terminal employing this multilayered flexible printed wiring board.

A rapid popularization of mobile telephone terminals (hereinafter referred to also as mobile telephones) has occurred in recent years. With the main objective of compacting the mobile telephone, this has been accompanied by an increased demand for fold-up mobile telephones. FIG. 1 is a schematic diagram of a fold-up mobile telephone. As shown in FIG. 1, the configuration of a fold-up mobile telephone comprises a first case 10, second case 30, and hinge part 20 that turnably connects the first case 10 and second case 30. The fold-up mobile telephone is foldable in the direction of the arrow shown in FIG. 1.

Flexible printed wiring boards (hereinafter also referred to as FPC substrates) are widely employed in mobile electronic devices, and in particular in mobile telephones, because of their excellent flexibility and flexure characteristics.

The FPC substrate referred to here (hereinafter also referred to as a 3-layered substrate) denotes a substrate comprising an adhesive layer on one or both surfaces of an electric insulating layer such as a polyimide film to which a conductor layer such as copper foil is laminate-adhered, or a substrate in which a coverlay comprising an electric insulating layer such as a polyimide film and adhesive layer is additionally laminate-adhered to the laminate-adhered conductor layer described above on which a circuit has been formed. The FPC 2-layered substrate (hereinafter also referred to as a 2-layered substrate) in the description denotes a substrate in which an electric insulating layer of polyimide or the like is coated and then cured on a conductor layer such as copper foil or the like, or a substrate in which a coverlay is additionally laminate-adhered on the conductor layer on which a circuit has been formed. The multilayered flexible printed wiring board (hereinafter also referred to as a multilayered FPC substrate) in the description denotes a substrate in which a plurality of FPC substrates or 2-layered substrates are laminate-adhered by way of an adhesive layer in 2 or more layers in a range of variations.

FIG. 2 shows one usage example of an FPC substrate in a mobile telephone. As shown in FIG. 2, the role of an FPC substrate 200 is to electrically connect a circuit substrate 100 contained in the case 10 and a circuit substrate 300 contained in the case 30.

An increase in the wiring density of the circuit substrates themselves assembled in mobile telephones and a multilayering the circuit substrates has accompanied advancements in function and miniaturization of mobile telephones in recent years. Accordingly, there has been an increase in the instance of the multilayering of, for example, the circuit substrates 100, 300 contained in the cases 10, 30, and of the connecting of the case 10 and case 30 by the FPC substrate 200 based on the connection of a plurality of FPC substrates.

Methods for the connection thereof include a method based on the separate and independent installation of the circuit substrate 100 and circuit substrate 300 and the use of a connector for connecting the two substrates by way of the FPC substrate 200, and the use of a multilayered FPC substrate in which the circuit substrates 100, 300 and FPC substrate 200 are integrated.

FIG. 3 shows one example of a multilayered FPC substrate. As shown in FIG. 3, a multilayered FPC 400 is configured from the circuit substrate 100, circuit substrate 300, and the FPC substrate 200 positioned between the circuit substrate 100 and circuit substrate 300. Moreover, while not shown in the diagram, the circuit substrate 100 of FIG. 3 has a layered configuration identical to the circuit substrate 300 but with a different circuit pattern. For example, while if the circuit substrate 300 of FIG. 3 has a 6-layered configuration the circuit substrate 100 also has a 6-layered configuration, the circuit substrates 300 and 100 have different circuit patterns.

The circuit substrates 100 and 300 are configured by the laminate-adhering of a plurality of coverlay-affixed FPC substrates 70 (hereinafter simply referred to as the FPC substrate 70) and adhesive sheets 60. The FPC substrate 70 comprises an FPC substrate 40 comprising an electric insulating layer 42, adhesive layer 41 and conductor layer 43 on which a circuit is formed, and a coverlay 50 for covering the conductor layer 43. In addition, the coverlay 50 comprises an electric insulating layer 52 and adhesive layer 51. The FPC substrate 200 generally comprises an FPC substrate 70.

A multilayered FPC substrate constitutes an integrated multilayered FPC substrate that, to achieve a high densification and flattening thereof, does not comprise a connecting part.

In addition, in order to ensure adequate flexibility (flexure characteristics) in the flexure section of an integrated multilayered FPC substrate, the FPC substrates are not adhered in this section and only the circuit substrate section is laminate-adhered in this section.

A configuration in which a non-bonding part is provided in the flexure part of a multilayered flexible circuit substrate to prevent bonding of insulating layers has been disclosed (Japanese Unexamined Patent Application No. H7-312469).

However, a problem inherent to methods for the manufacture of integrated multilayered FPC substrates lies in the fact that, because the laminate-adhering is based on a heat-pressurizing treatment of, for example, 140 to 200° C.×20 to 50 kgf/cm², the connecting sections of the FPC adhere even without an adhesion sheet or the like and adequate flexibility cannot be maintained (or to put this another way, adequate flex resistance cannot be exhibited). The problem has been conventionally resolved by manually separating the individually adhered FPC substrates. This results in an additional problem of increased manufacturing costs.

SUMMARY

The problem being addressed by the present invention is the resolution of the problems inherent to the conventional art as described above.

Accordingly, an object of the present invention is to provide a flexible printed wiring board and multilayered flexible printed wiring board in which, using a method for laminating substrates comprising a non-adhesion section and an adhesion section, adhesion of the FPC substrates of a flexure part can be prevented and adequate flex-resistance can be maintained.

According to embodiment 1 of the present invention, a flexible printed wiring board comprising at least an electric insulating layer and a conductor layer in which the surface of the electric insulating layer has a 10-point average roughness of at least 1.5 µm and less than 2.0 µm and a contact angle of at least 60° and less than 120°, or has a 10-point average roughness of at least 2.0 µm and less than 4.0 µm, is provided. As a result, because adhesion of opposing electric insulating layers is prevented even when methods for laminating substrates comprising a non-adhering section and an adhering section based on high temperature heat-pressurization are used due to the undulating form of the surface of the electric insulating layers or the low number of surface functional groups, the flexibility of each of the flexible printed wiring boards is maintained and flex resistance is improved.

The electric insulating layers are preferably made of polyimide. As a result, adequate heat-resistance and pliability are imparted even when methods for laminating substrates comprising a non-adhering section and an adhering section based on high temperature heat-pressurization are used.

According to embodiment 2 of the present invention, a flexible printed wiring board comprising at least an electric insulating layer, an adhesive layer and a conductor layer in which the surface of the electric insulating layer has a 10-point average roughness of at least 1.5 µm and less than 2.0 µm and a contact angle of at least 60° and less than 120°, or has a 10-point average roughness of at least 2.0 µm and less than 4.0 µm, is provided. As a result, because adhesion of opposing electric insulating layers is prevented even when methods for laminating substrates comprising a non-adhering section and an adhering section based on high temperature heat-pressurization are used due to the undulating form of the surface of the electric insulating layers or the low number of surface functional groups, the flexibility of each of the flexible printed wiring boards is maintained and flex resistance is improved.

The electric insulating layers are preferably made of polyimide. As a result, adequate heat-resistance and pliability are imparted even when methods for laminating substrates comprising a non-adhering section and an adhering section based on high temperature heat-pressurization are used.

According to embodiment 3 of the present invention, a flexible printed wiring board in which a coverlay comprising an adhesive layer and an electric insulating layer is provided on a conductor layer and in which the surface of the electric insulating layer in the coverlay has a 10-point average roughness of at least 1.5 µm and less than 2.0 µm and a contact angle of at least 60° and less than 120°, or has a 10-point average roughness of at least 2.0 µm and less than 4.0 µm, is provided. As a result, because adhesion of opposing electric insulating layers is prevented even when methods for laminating substrates comprising a non-adhering section and an adhering section based on high temperature heat-pressurization due to the undulating form of the surface of the electric insulating layers or the low number of surface functional groups are used, the flexibility of each of the flexible printed wiring boards is maintained and flex resistance is improved.

According to embodiment 4 of the present invention, a multilayered flexible printed wiring board formed by lamination of two or more of the flexible printed wiring boards described above in which the surface of the electric insulating layers of two or more flexible printed wiring boards exposed in a bendable state are opposing in a non-adhered state, and in which a part of said flexible printed wiring boards is laminated on each of a first multilayered flexible printed wiring board and a second multilayered flexible printed wiring board, is provided. As a result, the flexibility of the flexible printed wiring board is maintained and flex resistance is improved.

According to embodiment 5 of the present invention, a mobile telephone terminal comprising a hinge section for turnably connecting a first case and a second case that employs a multilayered flexible printed wiring board in which the surface of electric insulating layers of two or more exposed flexible printed wiring boards of a flexure part of the multilayered printed wiring board as described in claim 6 that pass through the hinge part are opposing in a non-adhered state is provided. As a result, the flexibility of the flexible printed wiring board is maintained and flex resistance is improved.

In addition, the present invention provides a metal-clad laminated board used in the flexible printed wiring boards or the mobile telephone terminal described above that comprises at least an electric insulating layer and a conductor layer prior to circuit formation, and in which the surface of the electric insulating layer has a 10-point average roughness of at least 1.5 µm and less than 2.0 µm and a contact angle of at least 60° and less than 120°, or has a 10-point average roughness of at least 2.0 µm and less than 4.0 µm.

In addition, the present invention provides a coverlay used in the flexible printed wiring boards of embodiments 3 and 4 or the mobile telephone terminal described above that comprises an adhesive layer and an electric insulating layer and in which the surface of the electric insulating layer has a 10-point average roughness of at least 1.5 µm and less than 2.0 µm and a contact angle of at least 60° and less than 120°, or has a 10-point average roughness of at least 2.0 µm and less than 4.0 µm.

All the characteristics necessary to the present invention are not described in the inventions indicated above, and other new inventions are possible by the combination thereof.

DETAILED DESCRIPTION

While the present invention will be hereinafter described with reference to embodiments thereof, these embodiments should in no way be regarded as limiting the inventions pertaining to the claims and, furthermore, not all combinations of the characteristics described in the embodiments are indispensable to the resolving means of the invention.

Flexible Printed Wiring Board of Embodiment 1

As embodiment 1 of the flexible printed wiring board of the present invention, a flexible printed wiring board comprising at least an electric insulating layer and a conductor layer, and in which the electric insulating layer surface has a 10-point average roughness of at least 1.5 μm and less than 2.0 μm and contact angle of at least 60° and less than 120°, or has a 10-point average roughness of at least 2.0 μm and less than 4.0 μm, is provided.

Figure 1:
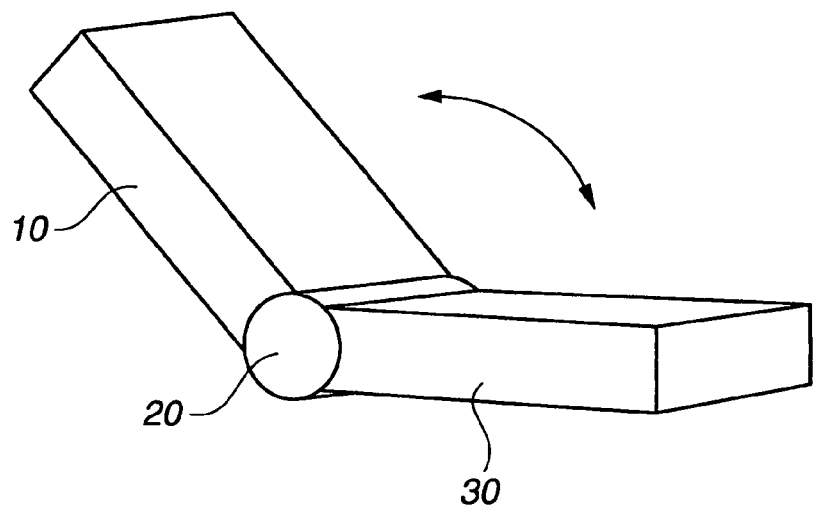
FIG. 1 is a schematic diagram of a fold-up mobile telephone.
Figure 2:
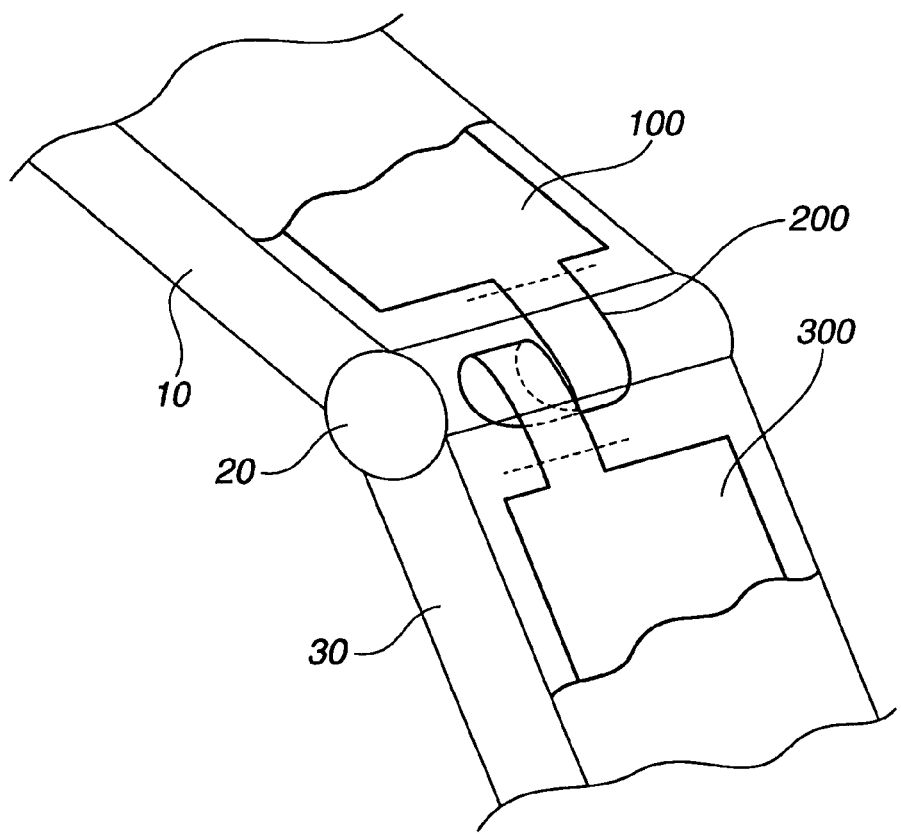
FIG. 2 is a schematic diagram of a usage example of an FPC substrate in a mobile telephone.
Figure 3:
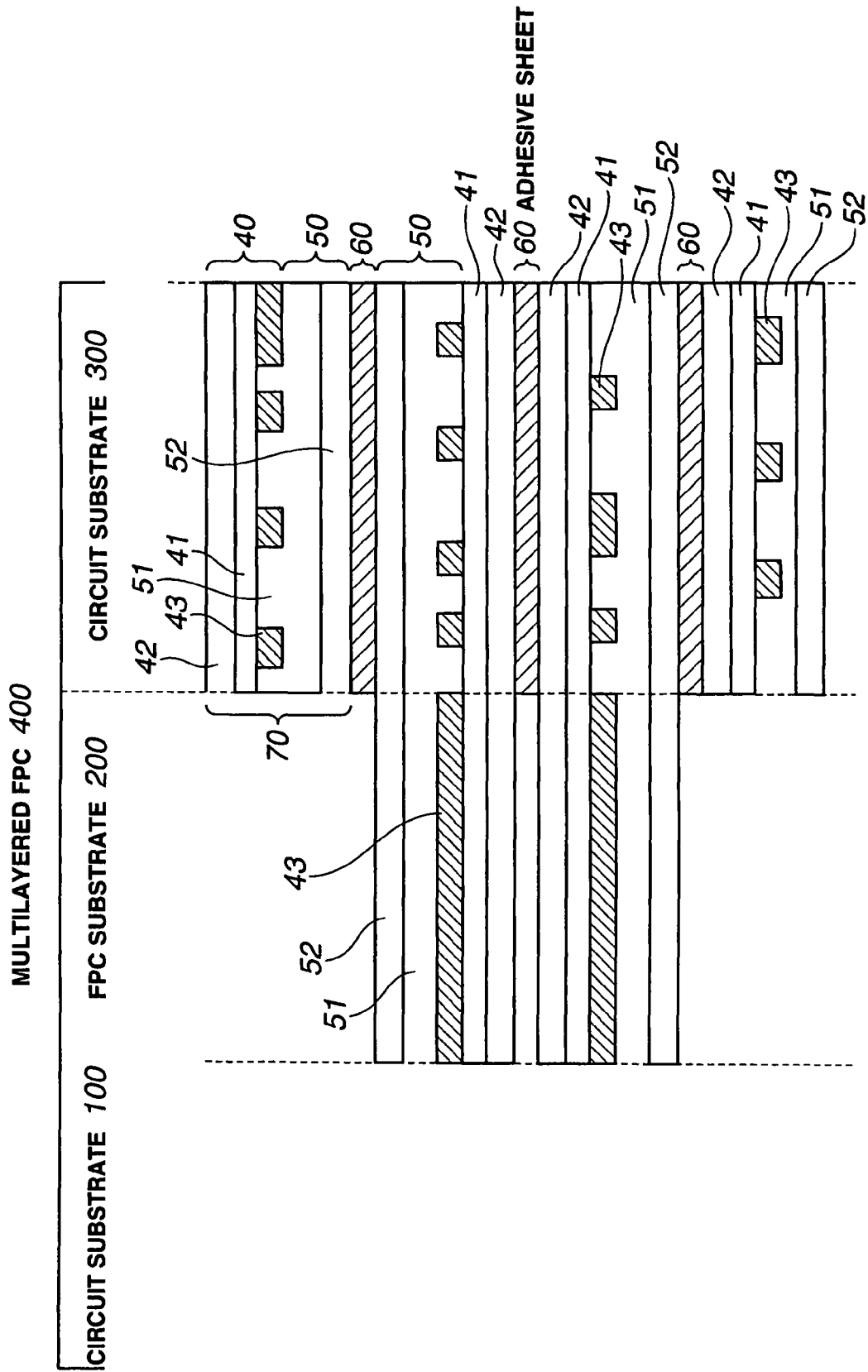
FIG. 3 is a cross-sectional view of an example of a multilayered FPC substrate.
Figure 4:
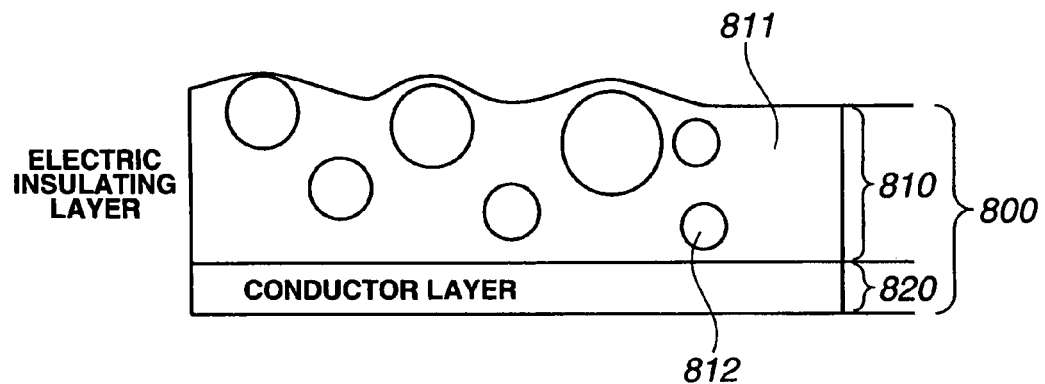
FIG. 4 is a cross-sectional view of a flexible printed wiring board of embodiment 1.

FIG. 4 is a cross-sectional view of the flexible printed wiring board of embodiment 1.

In FIG. 4 a flexible printed wiring board 800 is configured from a conductor layer 820 and an electric insulating layer 810.

The electric insulating layer 810 of embodiment 1 constitutes a resin composition that comprises, as essential components, an electrical insulating resin 811 and a filler 812.

In addition, the surface of the electric insulating layer 810 describes an undulating form that has a 10-point average roughness of at least 1.5 μm and less than 2.0 μm and contact angle of at least 60° and less than 120°, or has a 10-point average roughness of at least 2.0 μm and less than 4.0 μm.

As a result, when a plurality of the flexible printed wiring boards described above are laminated, because adhesion of opposing electric insulating layers is prevented by employing the flexible printed wiring boards of the configuration described above even when a method for laminating substrates comprising a non-adhering section and an adhering section based on high-temperature high-pressurization of the order of, for example, 140 to 200° C.×20 to 50 kgf/cm² is used, the flexibility of each of the flexible printed wiring boards is maintained and flex resistance is improved.

If this method is implemented at temperatures equal to less than the heating temperature noted above other characteristics, namely the circuit embedded characteristics (which drops) and the adhesion characteristics, are not adequately exhibited.

Methods for imparting the undulating form to the surface of the electric insulating layer 810 include a method for forming an undulating form on the surface of the electric insulating layer 810 based on the provision of the resin composition noted above in the conductor layer 820 (hereinafter referred to as a filler-adding method), and a method for forming an undulating form on the surface of the electric insulating layer 810 based on the use of a physical method such as a sand-blasting method in which, following the formation of the electric insulating layer 810 on the conductor layer 820, microparticles or the like are blown thereon and a surface-roughening of the surface is performed (hereinafter referred to as the surface-roughening method).

The undulating form of the surface of the electric insulating layer 810 is imparted in embodiment 1 of the present invention by means of the filler-adding method.

The results of various tests conducted using the filler-adding method revealed that the undulating form of the surface is affected by the amount of filler added. The filler 812 is preferably added in the amount of 0.2 to 20 parts by weight, and more preferably in the amount of 0.2 to 10 parts by weight per 100 parts by weight of cured electric insulating resin. When the amount of filler 812 is less than 0.2 parts by weight adequate surface undulation cannot be formed on the surface of the electric insulating layers whereupon, when the opposing electric insulating layers are subject to heat-pressurization the layers adhere which, in turn, prevents adequate flexibility from being produced and adequate flex resistance from being exhibited. In addition, when the filler is added in an amount of 20 parts by weight or more, it prevents the desired electrical characteristics and so on from being exhibited.

As the electric insulating resin 811, a resin with insulation characteristics such as a polyimide, polyamide or polyamideimide resin is used and, of these, from the viewpoint of its heat-resistance and so on, polyimide is particularly preferred.

As the filler 812 inorganic particles of calcium hydrogen phosphate, silica, talc or alumina or the like are used and, of these, from the viewpoint of its dispersibility in resins and its particle hardness and so on, calcium hydrogen phosphate is particularly preferred. The particle diameter of the filler is preferably 0.5 to 5 μm, and from the viewpoint of manufacturing including the coating step a particle diameter of 1 to 3 μm is preferred.

As the conductor layer 820 a metal foil or the like of, for example, copper, silver or aluminum is used. There are no particular problems associated with the metal foil thickness provided it is within the thickness range used in this particular field.

In addition, various additives including levelling agents, coupling agents or defoaming agents may be added in accordance with need within a range that does not affect the various characteristics of the resin composition noted above.

As a method for coating the electric insulating layer implemented in this embodiment, the resin composition noted above is coated on the conductor layer using, for example, a method of coating based on the use of a comma coater, die coater or gravure coater and then heat-cured to form the electric insulating layer.

The electric insulating layer may comprise a single layer of a resin composition comprising an electric insulating resin and filler, or it may comprise a plurality of layers formed by the provision of a layer comprising an electric insulating resin on the conductor layer and the provision thereon of the resin composition noted above.

As the method of surface roughening, following the coating of the electric insulating layer comprising the electric insulating resin on the conductor layer by the coating method described above and heat-curing thereof, a sandblasting method, wetblasting method, brushing treatment or buffer treatment or the like may be implemented on the surface of the electric insulating layer to form the desired undulation.

From the viewpoint of multilayering the FPC substrates, the thickness of the electric insulating layer 810 is preferably in the range of 10 to 50 μm, and more preferably in the range of 10 to 25 μm.

Flexible Printed Wiring Board of Embodiment 2

As embodiment 2 of the flexible printed wiring board of the present invention, a flexible printed wiring board comprising at least an electric insulating layer, adhesive layer and a conductor layer, and in which the electric insulating layer surface has a 10-point average roughness of at least 1.5 μm and less than 2.0 μm and contact angle of at least 60° and less than 120°, or has a 10-point average roughness of at least 2.0 μm and less than 4.0 μm, is provided.

Figure 5:
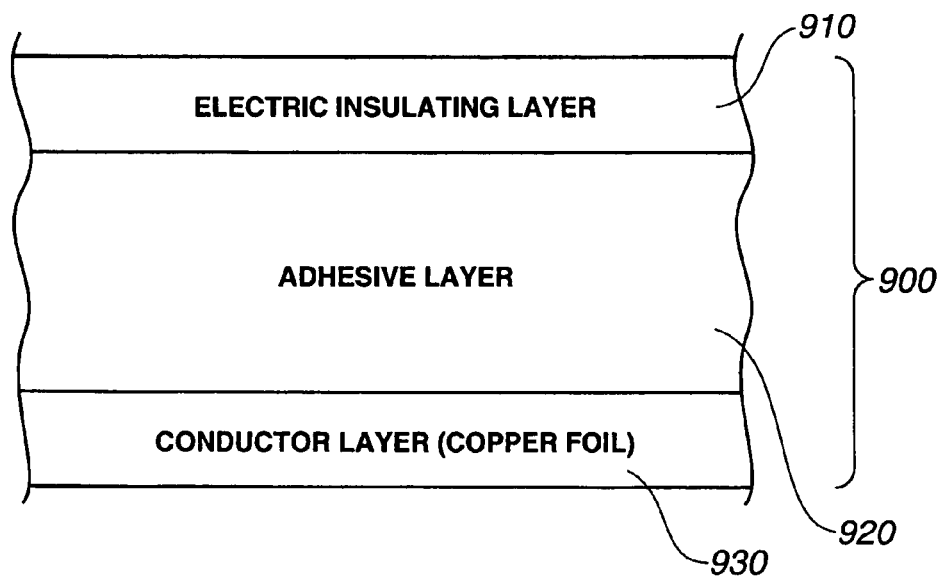
FIG. 5 is a cross-sectional view of a flexible printed wiring board of embodiment 2.

FIG. 5 is a cross-sectional view of the flexible printed wiring board of embodiment 2.

In FIG. 5, a flexible printed wiring board 900 is configured from a conductor layer 930, adhesive layer 920 and an electric insulating layer 910.

The electric insulating layer 910 of embodiment 2 comprises an electric insulating film, and the surface of the electric insulating layer 910 has a 10-point average roughness of at least 1.5 μm and less than 2.0 μm and contact angle of at least 60° and less than 120°, or a 10-point average roughness of at least 2.0 μm and less than 4.0 μm.

As a result, when a plurality of the flexible printed wiring boards described above are laminated, because adhesion of opposing electric insulating layers is prevented by employing the flexible printed wiring boards of the configuration described above even when a method for laminating substrates comprising a non-adhering section and an adhering section based on high-temperature high-pressurization of the order of, for example, 140 to 200° C.×20 to 50 kgf/cm$^2$ is used, the flexibility of each of the flexible printed wiring boards is maintained and flex resistance is improved.

The methods used to produce an electric insulating layer 910 with a surface that has a 10-point average roughness of at least 1.5 µm and less than 2.0 µm and contact angle of at least 60° and less than 120° are methods that do not introduce hydrophilic functional groups such as hydroxyl groups and carboxyl groups to the electric insulating layer film. Specific examples thereof include plasma treatment, corona treatment and coupling treatment surface treatment methods.

The surface of the electric insulating layer 910 of embodiment 2 of the present invention is obtained by the non-treatment thereof. In addition, to improve adhesive strength, a surface treatment may be administered on the surface of the electric insulating layer on which the adhesive layer is provided.

The mechanism by which adhesion of the surfaces of the opposing electrical insulating layers is prevented by non-treatment of the surface of the electric insulating film is surmised below.

The conventionally used method for improving adhesion between an electric insulating layer and an adhesive layer is based on surface functional groups (more particularly, hydrophilic functional groups such as carboxyl groups and hydroxyl groups) being introduced to the electric insulating layer as a result of the administering of a surface treatment such as a plasma treatment or corona treatment or the like. This method improves adhesion by utilizing the chemical bonds between the surface functional groups introduced into the insulating layer and the reactive functional groups within the adhesive composition, or secondary cohesive bonds such as hydrogen bonds.

It is thought that an adhesion phenomenon produced by secondary cohesive bonds occurs in the present invention because, under heat-pressurization with the electric insulating layers comprising the surface functional groups opposing, the layers adhere and, accordingly, it is surmised that the number of surface functional groups on the electric insulating layers must, as far as possible, be reduced.

Because of the tendency for the contact angle to increase when the number of surface functional groups is low and, conversely, for it to decrease when the number of surface functional groups is high, the appraisal of contact angle is used as the method in the present invention for appraising the presence of surface functional groups.

As is described above, in this embodiment of the present invention, when the surface of the electric insulating layers has a 10-point average roughness of at least 1.5 µm and less than 2.0 µm the contact angle is at least 60° and less than 120°. Even if the surface of an electric insulating layer has a 10-point average roughness of at least 1.5 µm and less than 2.0 µm, when the contact angle is less than 60° heat-pressurization in a form in which the surfaces of each of the layers are opposing results in the adhesion of the layers.

In addition, the 10-point average roughness of at least 2.0 µm and less than 4.0 µm of the surface of the electric insulating layer 910 may be established by employing a surface-roughening method such as a sandblasting method, wetblasting method or brushing treatment.

Notably, when the contact angle is less than 60° when the surface roughness is at least 2.0 µm and less than 4.0 µm the effect of the surface functional groups is reduced because of the reduction in the contact area afforded by the surface undulations. Accordingly, no adhesion phenomenon occurs.

There are no particular limitations to the adhesive layer 920 provided the adhesive is one that is used in the field of flexible printed wiring boards, and an adhesive layer of which the base is an epoxy resin is used.

From the viewpoint of FPC substrate multilayering, the thickness of the adhesive layer 920 is preferably within the range of 5 to 50 µm, and more preferably within the range of 10 to 25 µm.

As the electric insulating layer 910, an electric insulating film such as a polyimide film, polyamide film, polyamideimide film or polyether ether ketone film is used. Of these, because of its adequate heat-resistance and pliability, polyimide is preferred. There are no particular limitations to the electric insulating layer thickness and, accordingly, it may be selected as appropriate in accordance with the design of the multilayered FPC substrate.

As the conductor layer 930, a metal foil of copper, silver or aluminum or the like is used. There are no particular limitations to the metal foil thickness and, accordingly, it may be selected as appropriate in accordance with the design of the desired multilayered FPC substrate.

The method for forming the flexible printed wiring board 900 of this embodiment is based on the formation of a flexible printed wiring board by coating an adhesive as appropriate on the electric insulating layer or conductor layer and the provision thereon of an electric insulating layer or conductor layer.

As the method of coating thereof, a comma coater, die coater or gravure coater or the like can be used in accordance with the coating thickness and so on.

Flexible Printed Wiring Board of Embodiment 3

As embodiment 3 of the flexible printed wiring board of the present invention, a flexible printed wiring board in which a coverlay comprising an adhesive layer and an electric insulating layer is provided on a conductor layer, and in which the surface of the electric insulating layer has a 10-point average roughness of at least 1.5 µm and less than 2.0 µm and contact angle of at least 60° and less than 120°, or the 10-point average roughness of at least 2.0 µm and less than 4.0 µm, is provided.

Figure 6:
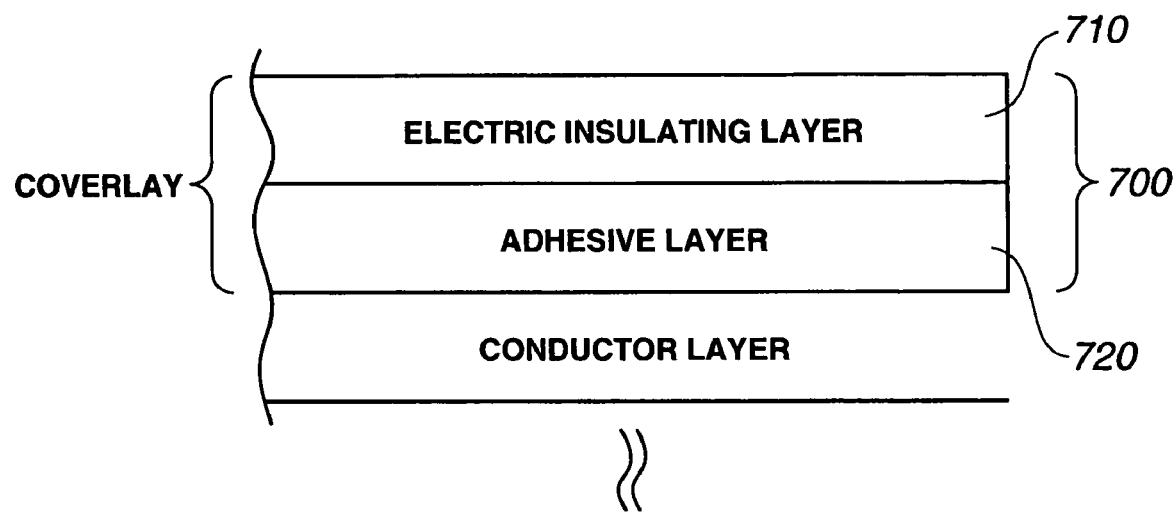
FIG. 6 is a cross-sectional view of a flexible printed wiring board of embodiment 3.

FIG. 6 is a cross-sectional view of the flexible printed wiring board of embodiment 3.

In FIG. 6, a coverlay 700 comprising an electric insulating layer 710 and adhesive layer 720 is provided on a conductor layer in which a circuit pattern such as that of the flexible printed wiring board of embodiment 1 or embodiment 2 is formed.

According to embodiment 3, which constitutes a flexible printed wiring board in which a coverlay comprising an adhesive layer and an electric insulating layer is provided on a conductor layer, the surface of the electric insulating layer surface has a 10-point average roughness of at least 1.5 µm and less than 2.0 µm and contact angle of at least 60° and less than 120°, or has a 10-point average roughness of at least 2.0 µm and less than 4.0 µm.

As a result, when a plurality of the various flexible printed wiring boards described above are laminated, because adhesion of opposing electric insulating layers is prevented by employing the flexible printed wiring boards of the configuration described above even under high-pressurization of the order of, for example, 140 to 200° C.×20 to 50 kgf/cm², the flexibility of each of the flexible printed wiring boards is maintained and flex resistance is improved.

The preferred method for producing the electric insulating layer 710 surface with a 10-point average roughness of at least 1.5 μm and less than 2.0 μm and contact angle of at least 60° and less than 120°, or 10-point average roughness of at least 2.0 μm and less than 4.0 μm is the method described for embodiment 2, and the surface of the electric insulating layer 710 is obtained by non-treatment. In addition, to improve adhesive strength, a surface treatment may be administered on the surface of the electric insulating layer on which the adhesive layer is provided.

The method for forming the coverlay 700 is based on the coating of an adhesive as appropriate on the surface of the electric insulating layer and the heat-drying thereof to produce a semi-cured state (hereinafter referred to as the B-stage). The flexible printed wiring board of embodiment 3 is formed by provision of the coverlay on the conductor layer on which a circuit pattern has been produced, and heat-curing thereof.

As the method of coating, a comma coater, die coater or gravure coater or the like can be used in accordance with coating thickness.

There are no particular limitations to the adhesive layer 720 provided the adhesive is one that is used in the field of flexible printed wiring boards, and an adhesive layer in which an epoxy resin forms the base is used.

From the viewpoint of multilayering of FPC substrates, the thickness of the adhesive layer 720 is preferably within the range of 5 to 50 μm, and more preferably within the range of 10 to 25 μm.

As the electric insulating layer 710, an electric insulating film such as, for example, a polyimide film, polyamide film, polyamideimide film or polyether ether ketone film is used. Of these, because of its adequate heat-resistance and pliability, the polyimide film is preferred. There are no particular limitations to the thickness of the electric insulating layer, and it is selected as appropriate in accordance with the design of the desired multilayered FPC.

Flexible Printed Wiring Board of Embodiment 4

As embodiment 4 of the flexible printed wiring board of the present invention, a multilayered flexible printed wiring board formed by the lamination of at least two or more of the flexible printed wiring boards of embodiment 3 or the like in which the surface of the electric insulating layers of two or more flexible printed wiring boards exposed in a bendable state are opposing in a non-adhered state, and in which a part of the flexible printed wiring boards is laminated on each of a first multilayered flexible printed wiring board and a second multilayered flexible printed wiring board, is provided.

Figure 7:
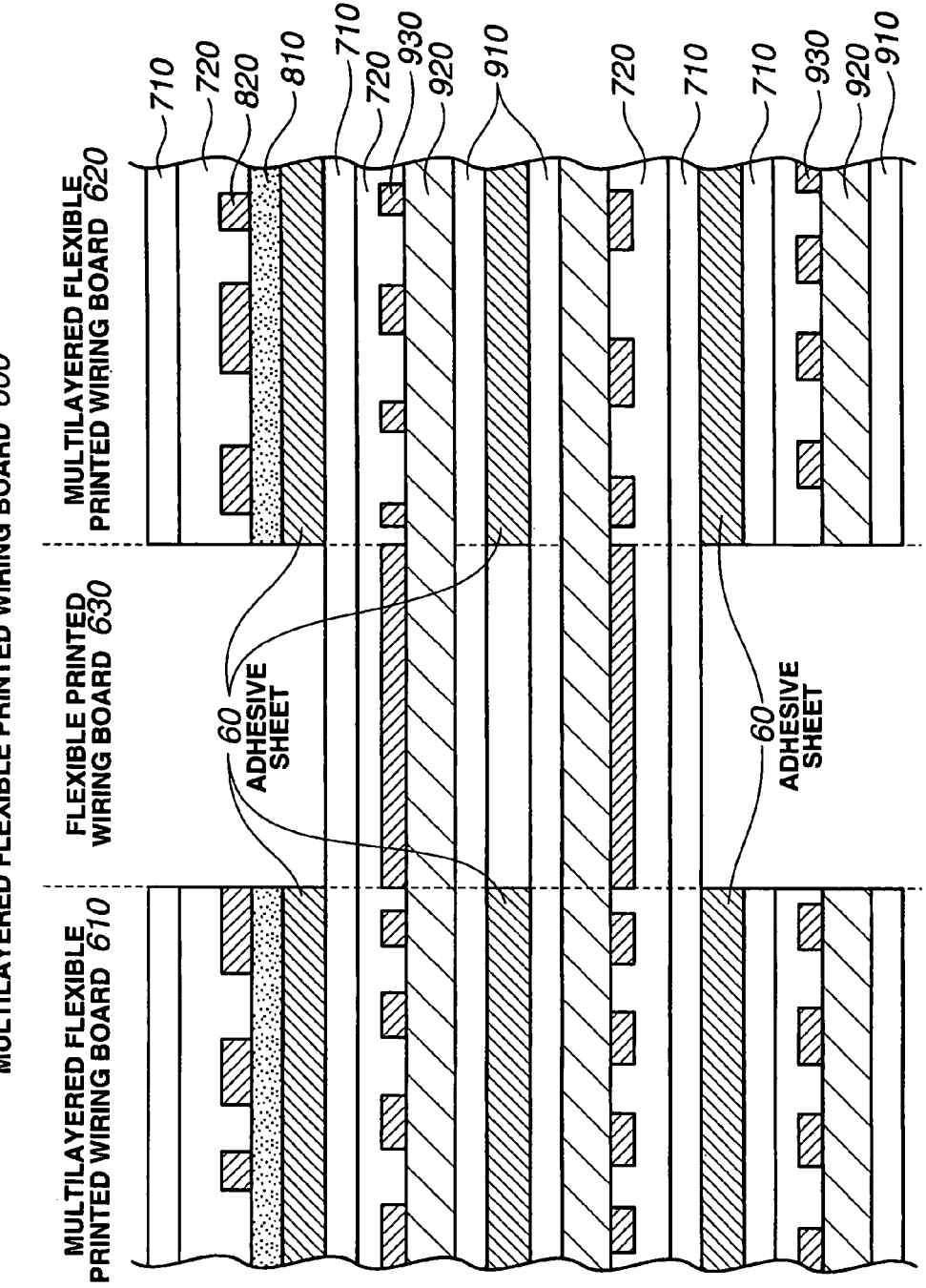
FIG. 7 is a cross-sectional view of a multilayered flexible printed wiring board of embodiment 4.

FIG. 7 shows a cross-sectional view of the multilayered flexible printed wiring board of embodiment 4. Identical symbols have been used to denote identical constituent parts in the following description.

In FIG. 7, a multilayered flexible printed wiring board 600 is configured from a first multilayered flexible printed wiring board 610, second multilayered flexible printed wiring board 620, and a flexible printed wiring board 630.

In accordance with need, in addition to the multilayered flexible printed wiring boards 610, 620, the multilayered flexible printed wiring board 600 may comprise other multilayered flexible printed wiring boards by way of the flexible printed wiring board 630.

The first and second multilayered flexible printed wiring boards 610, 620 can be laminated as a plurality of flexible printed wiring boards of a range of patterns from the flexible printed wiring boards of the previously described embodiments by way of a prepreg or resin sheet adhesive sheet 60 or the like in which an adhesive is impregnated in a glass cloth and formed in a semi-cured state.

Both surfaces of the flexible printed wiring board of the previously described embodiment of the flexible printed wiring board 630 are electrical insulating layers, and a part of this flexible printed wiring board exposed in a bendable state is laminated on the multilayered flexible printed wiring boards 610, 620. In addition, the electric insulating layers of two or more flexible printed wiring boards 630 are oppositely positioned in a non-adhered state.

According to embodiment 4 of the present invention which constitutes a multilayered flexible printed wiring board formed by lamination of at least two or more of the flexible printed wiring boards of embodiment 3, the electric insulating layer surfaces of the two or more flexible printed wiring boards exposed in a bendable state are opposing in a non-adhered state, and a part of the flexible printed wiring board is laminated on each of a first multilayered flexible printed wiring board and second multilayered flexible printed wiring board.

As a result, because adhesion of a plurality of bendable flexible printed wiring boards is prevented under high-temperature high-pressurization of the order of, for example, 140 to 200° C.×20 to 50 kgf/cm², the flexibility of each of the flexible printed wiring boards is maintained and flex resistance is improved.

Flexible Printed Wiring Board of Embodiment 5

As embodiment 5 of the flexible printed wiring board of the present invention, a mobile telephone terminal comprising a hinge section for turnably connecting a first case and a second case in which the surface of electric insulating layers of two or more flexible printed wiring boards exposed in a bendable state that pass through the hinge part are opposing in a non-adhered state, and which employs a multilayered flexible printed wiring board comprising these flexible printed wiring boards, is provided.

FIG. 8 is a structural diagram of the multilayered flexible printed wiring board that passes through the hinge part of a mobile telephone terminal of embodiment 5. Identical symbols have been used to denote identical constituent parts in the following description.

Figure 8A:
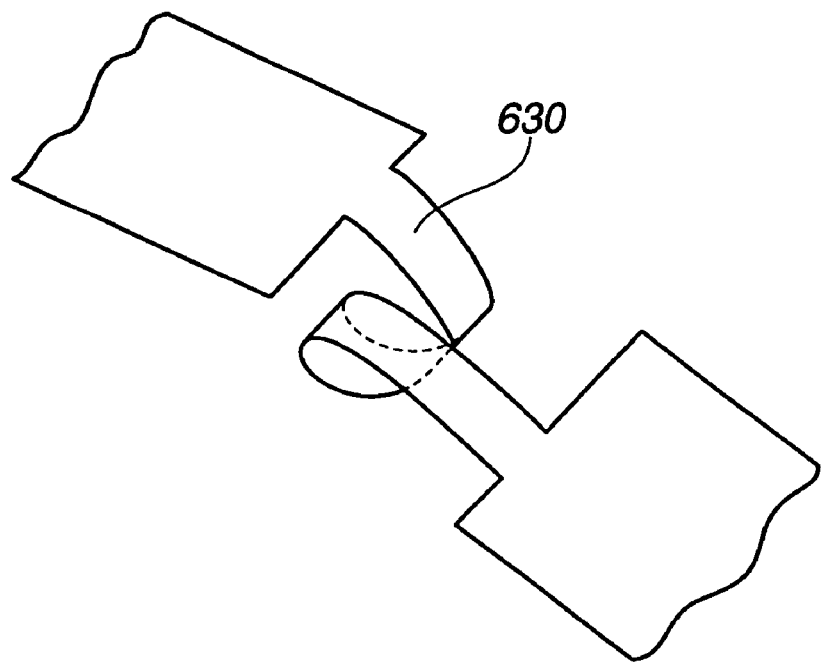
FIG. 8 is a cross-sectional view of a multilayered flexible printed wiring board of embodiment 5.

In FIG. 8A, a flexible printed wiring board 630 that passes through a hinge part 20 is wound in a spiral.

Figure 8B:
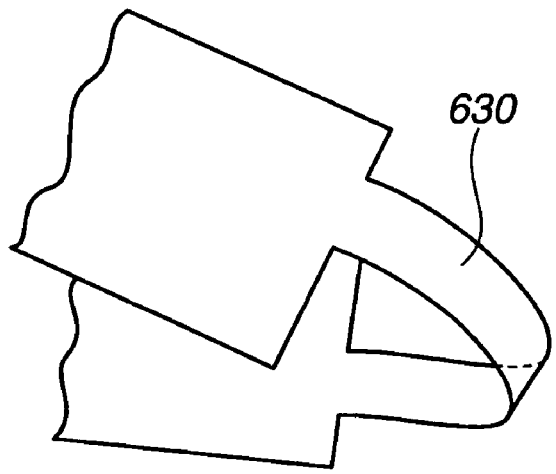

In FIG. 8B, a flexible printed wiring board 630 that passes through a hinge part 20 is wound in a U-shape.

According to embodiment 5 of the present invention, in a mobile telephone terminal comprising a hinge section for turnably connecting a first case and a second case, if the surface of electric insulating layers of two or more flexible printed wiring boards exposed in a bendable state are opposing in a non-adhered state and the multilayered flexible printed wiring board comprising these flexible printed wiring boards are employed, because the flexibility of the flexible wiring printed boards is maintained whenever the first case and second case are opened and closed in the state in which, as shown in FIG. 8, they pass through the hinge part, adequate flex resistance is demonstrated.

While the present invention is specifically described hereinafter with reference to working examples and test examples of the present invention, it should in no way be regarded as being restricted to the working examples.

WORKING EXAMPLES 1 TO 5 AND TEST EXAMPLES 1 TO 3

The surface roughness, contact angle, attachability and insulation breakdown voltage of 2-layered substrates were appraised, the results of which are shown in Table 1.

First, the compounds shown in Table 1 were prepared. The particulars of the components of Table 1 are outlined below.

Imide bonds of a polyimide resin are created by heat-curing a polyimide precursor resin. A typical polyimide precursor resin is polyamic acid. The polyimide precursor resin used in the working and comparative examples was polyamic acid obtained by the reaction of paraphenyldiamine, or diamines containing a derivative thereof, with aromatic tetracarboxylate.

Calcium hydrogen phosphate of peak particle distribution 1 to 3 μm was also used (average particle diameter of filler of 1 to 3 μm). When the polyimide precursor and calcium hydrogen phosphate were mixed, a solvent such as N-methyl-2-pyrrolidine was added in accordance with need and adjusted to a viscosity that is coatable on copper foil. The parts by weight of the polyimide resin of Table 1 denote the parts by weight of the cured polyimide.

Production of 2-Layered Substrate (Single Surface Copper-Clad Laminated Board).

The resin compositions of the compositions shown in Table 1 were coated on to the roughened surface of a rolled copper foil (manufactured by Nikko Materials Co., Ltd., BHY, 18 μm) using a bar coater to a thickness after curing of 25 μm.

The temperature was gradually raised over 10 min from 80° C. to 150° C. at which time the solvent was removed.

Next, in a nitrogen atmosphere, the temperature was gradually raised over 3 hours from 180° C. to 400° C. to effect curing.

Production of Coverlay

A resin composition (for example, the resin compositions described in Japanese Unexamined Patent Application No. 2001-15876 can be used) of which the principle component (for a coverlay) are epoxy resins normally employed in the field of flexible printed wiring boards was coated using a bar coater to a thickness after coating of 25 μm on the surface opposing the treated surface of a polyimide film (Manufactured by Kaneka Co., Ltd., 12.5 μm NPI) on which, on one surface, a predetermined treatment (sandblasting treatment) had been administered.

Following heat-drying for 5 min at 150° C. to effect the formation of the B-stage, a separating film (Manufactured by Rintech Inc., Separating PET film, 38 μm) was affixed by a laminator to the surface of the resin composition.

The separating film is designed to peel off during use.

Production of Flexible Printed Wiring Board

A coverlay adhesive surface from which a separating film had been peeled off was affixed to a 2-layered substrate or 3-layer substrate on which circuits had been formed and then press-moulded at conditions of 180° C.×20 kgf/cm²×60 minutes to produce the flexible printed wiring boards.

<10-Point Average Roughness>

Measurement device: Calculations were based on the following measurement method employing a laser microscope (Manufactured by Olympus Corp., LEXT OLS300).

(1) The surface to be measured was mounted on a stage (the surface to be measured in the working examples is a polyimide surface).

(2) A lens of magnification 100× was used and the focus was set.

(3) The Top and Bottom in the Z-axis direction was established from the image brightness.

(4) A 408 nm laser was irradiated and the reflected light thereof measured, and the surface was scanned in the 125 μm range in the X-axis direction and 96 μm range in the Y-axis direction.

(5) The cutoff value was set to ⅕, and surface roughness (Rz) was calculated employing an analysis software auxiliary to the measurement apparatus.

<Surface Contact Angle>

Measurement apparatus: Calculations were based on the following method employing a CA-X type measurement device manufactured by Kyowa Kaimen Kagaku Co., Ltd.

Figure 9:
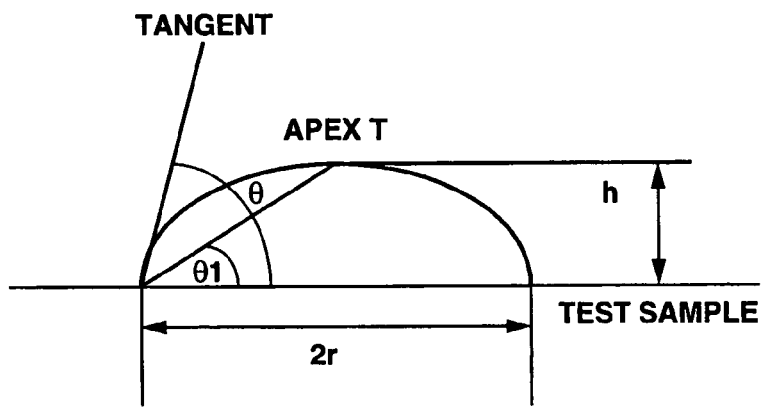
FIG. 9 is an explanatory diagram of a method for measuring the surface contact angle of the embodiments.

0.9 μl of purified water (droplets of 0.9 mm diameter) were drip-fed on to the measurement samples. Verification of the drip-fed purified water was based on the cross section thereof and involved measurement of the height h and radius 2r of the droplets as shown in FIG. 9. A contact angle θ was calculated using the following expression from the obtained h and 2r. FIG. 9 is a cross-sectional view of a drip-fed droplet of purified water.

$$\tan\theta 1 = h/r \; \theta = 2\tan^{-1}(h/r)$$

<Attachability>

Figure 10:
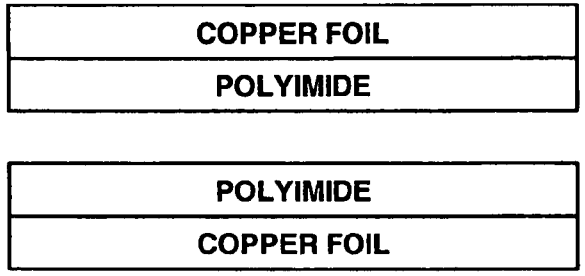
FIG. 10 is an explanatory diagram of a method for appraising the attachability of the embodiments (2-layered substrates)

Two sheets of a copper-clad laminated board were laminated onto a 2-layered substrate in the state shown in FIG. 10 and subjected to a 180 to 20 kgf/cm²×60 minute press treatment and then verified. An attachability test of the polyimides of the 2-layered copper-clad laminated boards made of identical resin compositions was carried out for each working example. The verification of attachability was based on observation with the naked eye and was appraised in accordance with the following standard.

◯: Not attached, x: Attached.

<Insulation Breakdown Voltage>

Employing an HVT-200-5 manufactured by Sanryo Denzai Corp. as the measurement device and taking the electrodes as 25 mmθ, the voltage was raised 500V/sec in a No. 2 insulating oil as prescribed by JIS C 2320 (Electric insulating oil) with the value at which insulation breakdown occurred being appraised. As the test sample, a material removed by an etching method or the like from the conductor layer of the substrate and cut into 100 mm squares was employed. The appraisal was based on the measurement results in accordance with the following standards.

◯: 200V/μm or above, excellent insulation breakdown voltage.

Δ: 100 μm or greater and less than 200V/μm, insulation breakdown voltage of a level in which there are no problems in actual application.

TABLE 1

|  | Working Example 1 | Comparative Example 1 | Working Example 2 | Working Example 3 | Working Example 4 | Working Example 5 | Comparative Example 2 | Comparative Example 3 |
|---|---|---|---|---|---|---|---|---|
| Polyimide resin※1 | 100 | 100 | 100 | 100 | 100 | 100 | 100 | 100 |
| Calcium hydrogen phosphate | 0.2 | 0.2 | 3 | 3 | 10 | 10 | 0 | 20 |
| Corona treatment | Not processed | processed | Not processed | processed | Not processed | processed | Not processed | Not processed |
| 10-point average roughness | 1.9 | 1.9 | 2.5 | 2.5 | 3.6 | 3.6 | 1 | 4.4 |
| Surface contact angle | 65° | 55° | 65° | 55° | 65° | 55° | 65° | 65° |
| Attachability | ○ | x | ○ | ○ | ○ | ○ | x | ○ |
| Insulation breakdown voltage | ○ | ○ | ○ | ○ | ○ | ○ | ○ | Δ |

※1; Polyimide resin: Heat-cured polyamic acid produced as 100 parts by weight polyimide resin.
Composition unit (polyimide resin and calcium hydrogen phosphate) unit of parts by weight.
10-point average roughness unit of μm.

WORKING EXAMPLES 6 TO 8 AND COMPARATIVE EXAMPLE 4

The surface processed state and attachability of polyimide film on a 3-layered substrates was appraised, the results of which are shown in Table 2. The methods of measurement and appraisal were identical to the methods described above and, accordingly, there is no particular detailed description given thereof.

Production of 3-Layered Substrate (Single Surface Copper-Clad Laminated Board)

A resin composition (for example, the resin compositions described in Japanese Unexamined Patent Application No. 2001-15876 can be used) of which the principle component (for a substrate) are epoxy resins normally employed in the field of flexible printed wiring boards and so on was coated using a bar coater to a thickness after coating of 10 μm on the surface opposing the treated surface of a polyimide film (Manufactured by Kaneka Co., Ltd., Apical 12.5 μm NPI) on which, on one surface, a predetermined treatment (sandblasting treatment) had been administered.

Following heat-drying for 5 min at 150° C. to effect the formation of the B-stage, a rolled copper film (Manufactured by Nikko Materials Co., Ltd., BHY, 18 μm) was affixed by a laminator to the surface of the resin compositions.

The temperature was raised gradually over 3 hours from 40° C. to 200° C. to effect the perfect curing of the resin compositions and produce a single surface copper-clad laminated board.

<Attachability>

Figure 11:
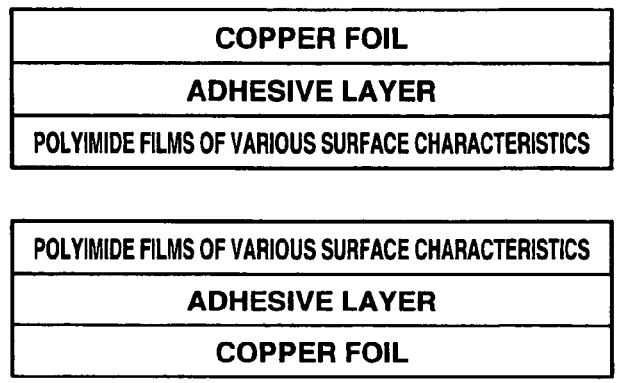
FIG. 11 is an explanatory diagram of the method for appraisal of the attachability of the embodiments (3-layered substrates).

Two sheets of copper-clad laminated board produced employing polyimides of various characteristics were laminated on 3-layered substrates in the state shown in FIG. 11 and subjected to a 180 to 20 kgf/cm²×60 minute press treatment and then verified. The attachability test was carried out with the polyimide surfaces of the 3-layered copper-clad laminated boards produced from each film opposing. The verification of attachment was based on observation with the naked eye and was appraised in accordance with the following standards. O: Not attached, X: Attached.

TABLE 2

| Film surface characteristics | Working Example 6 | Working Example 7 | Comparative Example 4 | Working Example 8 |
|---|---|---|---|---|
| 10-point average roughness (Rz) | 1.9 | 1.9 | 1.9 | 3.6 |
| Surface contact angle | 65° | 10°※2 | 55°※3 | 65°※4 |
| Attachability | ○ | ○ | X | ○ |

10-point average roughness unit of μm.
The particulars of the measurements in Table 2 annotated with the symbol ※ are indicated below.
※2; Polyimide film plasma-processed in a nitrogen atmosphere to which a minute amount of $CF_4$ (carbon tetrafluoride) or $C_2F_6$ (perfluoroethane) was added.
※3※; Corona treated,
※4※: Sandblasting treated.

While the surface treatment implemented in the working examples was a sandblasting treatment, there are no particular limitations to the present invention in terms of the surface treatment method. Examples of other treatment methods that can be used for surface roughening include wetblasting methods and brushing treatments and so on.

The present invention has industrial applicability as a flexible printed wiring board, multilayered flexible printed wiring board and mobile telephone terminal in which, in methods for laminating of substrates with a non-adhering part and an adhering part, adhesion of the FPC substrates of a flexure part can be prevented, and adequate flex resistance can be maintained.

We claim:
1. A flexible printed wiring board comprising:
a first electric insulating layer having a first surface and a second surface opposite the first surface;
a second electric insulating layer having a first surface and a second surface opposite its first surface;
a first conductor layer located on the first surface of the first electric insulating layer;
a second conductor layer located on the first surface of the second electric insulating layer;
wherein:
the second surface of each said electric insulating layer is undulated and has:
(a) a 10-point average roughness of at least 1.5 μm and less than 2.0 μm and a contact angle of at least 60° and less than 120°, or

(b) has a 10-point average roughness of at least 2.0 μm and less than 4.0 μm; and the second surfaces of the first and second electric insulating layers are adjacent, face each other, and do not stick together.

2. The flexible printed wiring board as described in claim 1, wherein at least one of the first and second electric insulating layers is made of polyimide.

3. The flexible printed wiring board as claimed in claim 1, further comprising an adhesive layer between the first insulating layer and the first conductor layer.

4. The flexible printed wiring board as described in claim 3, wherein at least one of the first and second electric insulating layers is made of polyimide.

5. The flexible printed wiring board as described in claim 1, wherein the first insulating layer and an adhesive layer form a coverlay provided on the first conductor layer, wherein the adhesive layer is provided between the first surface of the first insulating layer and the first conductor layer.

6. A flexible printed wiring board comprising:
a first electric insulating layer having a first surface and a second surface opposite the first surface;
a second electric insulating layer having a first surface and a second surface opposite its first surface;
a first conductor layer located on the first surface of the first electric insulating layer;
a second conductor layer located on the first surface of the second electric insulating layer;

wherein:
at least one of the second surfaces of the electric insulating layers is undulated and has:
(a) a 10-point average roughness of at least 1.5 μm and less than 2.0 μm and a contact angle of at least 60° and less than 120°, or
(b) has a 10-point average roughness of at least 2.0 μm and less than 4.0 μm; and
the second surfaces of the first and second electric insulating layers are adjacent, face each other, and do not stick together.

7. The flexible printed wiring board as described in claim 6, wherein at least one of the first and second electric insulating layers is made of polyimide.

8. The flexible printed wiring board as claimed in claim 6, further comprising an adhesive layer between the first insulating layer and the first conductor layer.

9. The flexible printed wiring board as described in claim 8, wherein at least one of the first and second electric insulating layers is made of polyimide.

10. The flexible printed wiring board as described in claim 6, wherein the first insulating layer and an adhesive layer form a coverlay provided on the first conductor layer, wherein the adhesive layer is provided between the first surface of the first insulating layer and the first conductor layer.

* * * * *